United States Patent
Adiga-Manoor et al.

(10) Patent No.: US 9,024,559 B2
(45) Date of Patent: May 5, 2015

(54) VARIABLE SPEED DRIVE

(75) Inventors: Shreesha Adiga-Manoor, York, PA (US); Michael S. Todd, Jacobus, PA (US); Ivan Jadric, York, PA (US)

(73) Assignee: Johnson Controls Technology Company, Holland, MI (US)

( * ) Notice: Subject to any disclaimer, the term of this patent is extended or adjusted under 35 U.S.C. 154(b) by 209 days.

(21) Appl. No.: 13/640,322

(22) PCT Filed: May 4, 2010

(86) PCT No.: PCT/US2010/033499
§ 371 (c)(1),
(2), (4) Date: Oct. 10, 2012

(87) PCT Pub. No.: WO2011/139269
PCT Pub. Date: Nov. 10, 2011

(65) Prior Publication Data
US 2013/0026958 A1    Jan. 31, 2013

(51) Int. Cl.
*H02P 6/00*    (2006.01)
*H03K 17/16*    (2006.01)
(Continued)

(52) U.S. Cl.
CPC .............. *H03K 17/168* (2013.01); *H02P 27/06* (2013.01); *H03K 17/107* (2013.01); *H03K 17/127* (2013.01); *H03K 17/163* (2013.01)

(58) Field of Classification Search
CPC ........... F25B 2600/021; F25B 49/025; H02M 5/4585; H02M 1/36; H02M 2001/123; Y02B 30/741; H02P 2201/03; H02P 27/08; H02P 27/06
USPC ........... 318/400.3, 801, 434, 455, 800, 254.1; 363/34, 40, 44, 76, 77; 361/5, 23, 29, 361/31; 335/18, 155
See application file for complete search history.

(56) References Cited

U.S. PATENT DOCUMENTS 3,621,366 A    11/1971    Duff et al.
4,697,131 A    9/1987    Schauder et al.
(Continued)

FOREIGN PATENT DOCUMENTS

CN    101305470 A    11/2008
CN    101351953 A    1/2009
(Continued)

OTHER PUBLICATIONS

Chinese Search Report, dated Mar. 5, 2014, 3 pages.
(Continued)

*Primary Examiner* — Rita Leykin
(74) *Attorney, Agent, or Firm* — McNees Wallace & Nurick LLC (57) ABSTRACT

A converter module for a variable speed drive having a semiconductor device for precharge is described. The precharge circuit includes switching modules, one switching module with a first semiconductor switch connected in parallel or series with a second semiconductor switch. The second semiconductor switch is switched on and off during the precharge operation in order to limit the inrush current into the DC Link. After the precharge operation, the second semiconductor switch is turned on all the time and acts like a diode. The second semiconductor device may have a lower maximum current rating than the main semi-conductor devices. The lower current rated semiconductor device experience the same short circuit current as the higher current rated semiconductor device. The lower current rated semiconductor device can be supplied with a larger gate to emitter voltage than the higher current rated semiconductor device to equalize current between semiconductor devices.

18 Claims, 9 Drawing Sheets

(51) Int. Cl.
*H02P 27/06* (2006.01)
*H03K 17/10* (2006.01)
*H03K 17/12* (2006.01)

(56) References Cited

U.S. PATENT DOCUMENTS

| | | | |
|---|---|---|---|
| 4,761,726 A | 8/1988 | Brown | |
| 4,864,483 A | 9/1989 | Divan | |
| 4,959,602 A | 9/1990 | Scott et al. | |
| 5,038,267 A | 8/1991 | De Donker et al. | |
| 5,274,541 A | 12/1993 | Kimura et al. | |
| 5,483,142 A | 1/1996 | Skibinski et al. | |
| 5,499,178 A | 3/1996 | Mohan et al. | |
| 5,570,279 A | 10/1996 | Venkataramanan | |
| 5,625,549 A | 4/1997 | Horvat | |
| 5,746,062 A | 5/1998 | Beaverson et al. | |
| 5,757,599 A | 5/1998 | Crane | |
| 5,889,667 A | 3/1999 | Bernet | |
| 5,909,367 A | 6/1999 | Change | |
| 6,050,083 A | 4/2000 | Meckler | |
| 6,163,472 A | 12/2000 | Colby | |
| 6,407,937 B2 | 6/2002 | Bruckmann et al. | |
| 6,507,503 B2 | 1/2003 | Norrga | |
| 6,566,764 B2 | 5/2003 | Rebsdorf et al. | |
| 6,603,675 B1 | 8/2003 | Norrga | |
| 6,625,046 B2 | 9/2003 | Geissler | |
| 6,657,874 B2 | 12/2003 | Yu | |
| 6,658,870 B1 | 12/2003 | Jenkins | |
| 6,704,182 B2 | 3/2004 | Bruckmann et al. | |
| 7,005,829 B2 * | 2/2006 | Schnetzka | 318/801 |
| 7,081,734 B1 * | 7/2006 | Jadric et al. | 318/801 |
| 7,202,626 B2 * | 4/2007 | Jadric et al. | 318/254.1 |
| 7,332,885 B2 * | 2/2008 | Schnetzka et al. | 318/400.01 |
| 7,439,702 B2 * | 10/2008 | Smith et al. | 318/701 |
| 7,555,912 B2 * | 7/2009 | Schnetzka et al. | 62/228.4 |
| 7,619,906 B2 * | 11/2009 | Schnetzka | 363/34 |
| 7,957,166 B2 * | 6/2011 | Schnetzka et al. | 363/56.03 |
| 8,014,110 B2 * | 9/2011 | Schnetzka et al. | 361/31 |
| 2002/0176261 A1 | 11/2002 | Norrga | |
| 2003/0133317 A1 | 7/2003 | Norrga | |
| 2003/0168919 A1 | 9/2003 | Friedrichs et al. | |
| 2003/0231518 A1 | 12/2003 | Peng | |
| 2004/0008005 A1 | 1/2004 | Sakai et al. | |
| 2004/0012986 A1 | 1/2004 | Riggio et al. | |
| 2005/0190511 A1 | 9/2005 | Crane et al. | |
| 2006/0208685 A1 | 9/2006 | Schnetzka | |
| 2007/0063668 A1 * | 3/2007 | Schnetzka et al. | 318/812 |
| 2007/0151272 A1 * | 7/2007 | Cosan et al. | 62/228.1 |
| 2008/0106319 A1 | 5/2008 | Bayerer | |
| 2008/0315364 A1 | 12/2008 | Nemoto | |
| 2009/0109713 A1 | 4/2009 | Schnetzka et al. | |
| 2009/0296441 A1 | 12/2009 | Klemt et al. | |

FOREIGN PATENT DOCUMENTS

| | | |
|---|---|---|
| EP | 2117121 A1 | 11/2009 |
| WO | 2004098038 A1 | 11/2004 |

OTHER PUBLICATIONS

Silicon Carbide npnp Thyristors, John H. Glenn Research Center, Cleveland, Ohio, downloaded from http://www.nasatech.com/Briefs/Dec00/LEW16750.html on Oct. 8, 2012, 2 pages.

* cited by examiner

VARIABLE SPEED DRIVE

BACKGROUND

The application generally relates to variable speed drives. The application relates more specifically an electronics power assembly in a variable speed drive.

A Variable Speed Drive (VSD) is a system that can control the speed of an alternating current (AC) electric motor by controlling the frequency and voltage of the electrical power supplied to the motor. VSDs may be used in various applications, for example, ventilations systems for large buildings, pumps and machine tool drives.

A VSD incorporates several stages to provide speed control to a motor. A VSD may include a rectifier or converter stage, a DC link stage, and an inverter stage. The rectifier or converter stage, also known as the converter, converts the fixed line frequency, fixed line voltage AC power from an AC power source into DC power. The DC link stage, also known as the DC link, filters the DC power from the converter and typically contains a large amount of electrical capacitance. Finally, the inverter stage, also known as the inverter, is connected in parallel with the DC link and converts the DC power from the DC link into a variable frequency, variable voltage AC power.

When electric power is applied to the VSD, the voltage across the DC link capacitors, referred to as the DC link voltage, rises from zero to a rated value. If the rise of the DC link voltage were left to occur uncontrolled, the rise in voltage level would occur very quickly by drawing very large electric currents from the AC power source through the rectifier and into the DC link capacitors. The large current drawn by the DC link capacitors, referred to as an inrush current, can be damaging to the components of the VSD. Thus, to avoid damage to the VSD components from inrush current, the rise of the DC link voltage from 0 V to the rated voltage should be controlled. The control of the DC link voltage is referred to as a DC link precharge operation, or precharge, of the circuit.

In some VSD applications that employ controlled charging, or precharging, of the capacitors to limit the inrush current, the converter is arranged to provide the precharge current to the DC link. The conduction of the semiconductor devices, such as insulated gate bipolar transistors (IGBTs) or other types of power switches or transistors used for rectifying the AC line voltage, is controlled so as to let only small pulses of inrush current flow during precharge operation of the VSD. The semiconductor devices used for controlling the inrush current during precharging are usually turned on all the time afterwards. These semiconductor devices used only during precharging can have a maximum rated current rating that is less than the maximum rated current of the main semiconductor devices.

The converter may be subject to harmful or destructive currents in the occurrence of a fault or short circuit condition on the input of the converter or output of the inverter. The harmful or destructive currents from a fault or short circuit can damage components of, or the entire VSD. Therefore, it is desirable to provide protection to the VSD during short circuit conditions to prevent damaging the semiconductor devices of the converter and other components of the electrical distribution system and the VSD.

The use of auxiliary semiconductor devices with lower maximum current rating along with higher current rated main semiconductor devices in the converter poses a problem to safely turn off during the short circuit or fault event. What is needed is a scheme to improve the reliability of such variable speed drive during short circuit or fault events.

SUMMARY

One embodiment relates to a converter module for a variable speed drive having a plurality of switching modules, one switching module of the plurality of switching modules having a first semiconductor switch connected in parallel or series with a second semiconductor switch, the second semiconductor switch being controllably switched during a precharge operation of the variable speed drive to limit an inrush current into the DC link. The second semiconductor switch has a maximum current rating that is less than a maximum current rating of the first semiconductor switch.

Another embodiment relates to a variable speed drive having a converter connected to an AC power source providing an input AC power. The converter converts the fixed input AC voltage to a DC voltage. The variable speed drive also includes a DC link connected to the converter. The DC link filters the DC voltage and store energy from the converter. The variable speed drive further includes an inverter connected to the DC link. The inverter converts a DC voltage from the DC link into the output power having a variable voltage and a variable frequency. The converter has a precharge circuit that has a plurality of switching modules, one switching module of the plurality of switching modules comprising a first semiconductor switch connected in parallel or series with a second semiconductor switch. The second semiconductor switch is controllably switched during a precharge operation of the variable speed drive to limit an inrush current into the DC link. The second semiconductor switch has a maximum current rating that is less than a maximum current rating of the first semiconductor switch.

Still another embodiment relates to a drive for a system having a variable speed drive. The variable speed drive receives an input AC power at a fixed input AC voltage and a fixed input frequency and provide an output power at a variable voltage and variable frequency. The variable voltage has a maximum voltage greater in magnitude than the fixed input AC voltage and the variable frequency has a maximum frequency greater than the fixed input frequency. The variable speed drive includes a converter connected to an AC power source providing an input AC power. The converter converts the fixed input AC voltage to a DC voltage. The variable speed drive also includes a DC link connected to the converter. The DC link filters the DC voltage and store energy from the converter. The variable speed drive further includes an inverter connected to the DC link. The inverter converts a DC voltage from the DC link into the output power having a variable voltage and a variable frequency. The converter has a precharge circuit that has a plurality of switching modules, one switching module of the plurality of switching modules comprising a first semiconductor switch connected in parallel or series with a second semiconductor switch. The second semiconductor switch being controllably switched during a precharge operation of the variable speed drive to limit an inrush current into the DC link. The second semiconductor switch has a maximum current rating that is less than a maximum current rating of the first semiconductor switch.

DETAILED DESCRIPTION OF THE EXEMPLARY EMBODIMENTS

Figure 1:
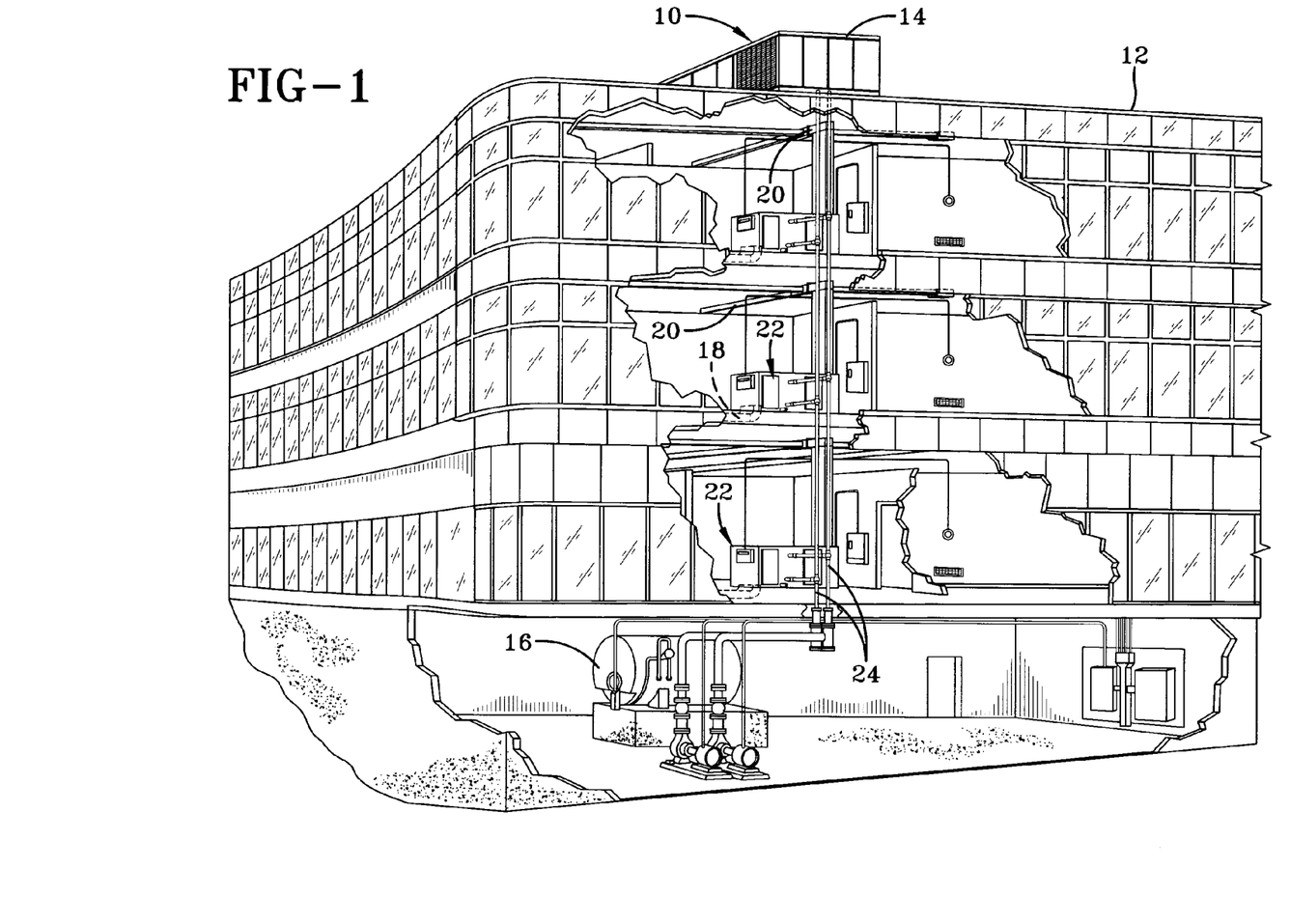
FIG. 1 shows an exemplary embodiment of a Heating, Ventilation, Air Conditioning and Refrigeration (HVAC & R) system in a commercial environment.

FIG. 1 shows an exemplary environment for a Heating, Ventilating, Air Conditioning system (HVAC system) 10 in a building 12 for a commercial setting. System 10 may include a compressor incorporated into a vapor compression system 14 that can supply a chilled liquid that may be used to cool building 12. System 10 can also include a boiler 16 used to heat building 12, and an air distribution system that circulates air through building 12. The air distribution system can include an air return duct 18, an air supply duct 20 and an air handler 22. Air handler 22 can include a heat exchanger that is connected to boiler 16 and vapor compression system 14 by conduits 24. The heat exchanger in air handler 22 may receive either heated liquid from boiler 16 or chilled liquid from vapor compression system 14, depending on the mode of operation of system 10. System 10 is shown with a separate air handler on each floor of building 12, but it will be appreciated that these components may be shared between or among floors.

Figure 2:
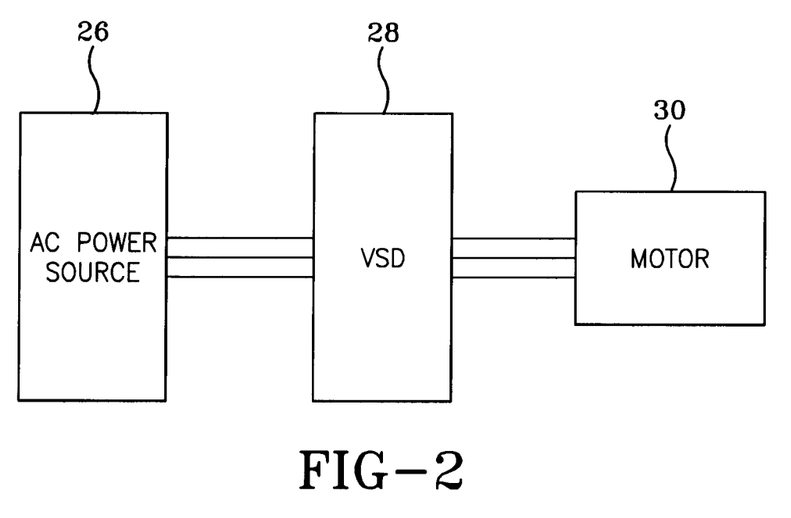
FIG. 2 diagrammatically shows an exemplary embodiment of a VSD system configuration.
Figure 3:
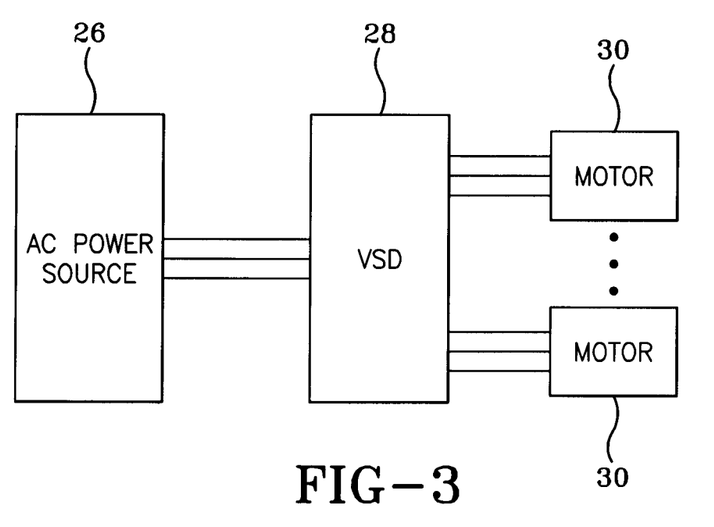
FIG. 3 diagrammatically shows an exemplary embodiment of a VSD system configuration with a plurality of motors.

FIGS. 2 and 3 illustrate system configurations including a variable speed drive (VSD) 28 that may be used for providing power to an HVAC system 10. An AC power source 26 supplies VSD 28, which powers a motor 30 (see FIG. 2) or motors 30 (see FIG. 3). The motor(s) 30 can be used to drive a corresponding compressor 38 of an HVAC, refrigeration or chiller system 10 (see generally, FIG. 6). AC power source 26 provides single phase or multi-phase (e.g., three phase), fixed voltage, and fixed frequency AC power to VSD 28 from an AC power grid or distribution system that is present at a site. AC power source 26 preferably can supply an AC voltage or line voltage of 200 V, 230 V, 380 V, 460 V, or 600 V, at a line frequency of 50 Hz or 60 Hz, to VSD 28 depending on the corresponding AC power grid.

VSD 28 receives AC power having a particular fixed line voltage and fixed line frequency from AC power source 26 and provides AC power to motor(s) 30 at a desired voltage and desired frequency, both of which can be varied to satisfy particular requirements. VSD 28 can provide AC power to motor(s) 30 having higher voltages and frequencies and lower voltages and frequencies than the rated voltage and frequency of motor(s) 30. In another embodiment, VSD 28 may provide higher and lower frequencies but only the same or lower voltages than the rated voltage and frequency of motor(s) 30. Motor(s) 30 may be an induction motor, but can also include any type of motor that is capable of being operated at variable speeds. The motor can also have any suitable pole arrangement including two poles, four poles or six poles.

Figure 4:
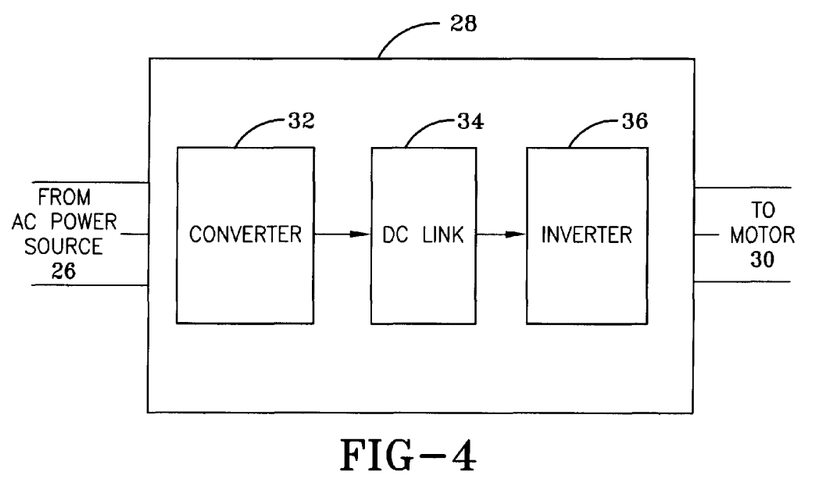
FIG. 4 diagrammatically an exemplary embodiment of a VSD system.
Figure 5:
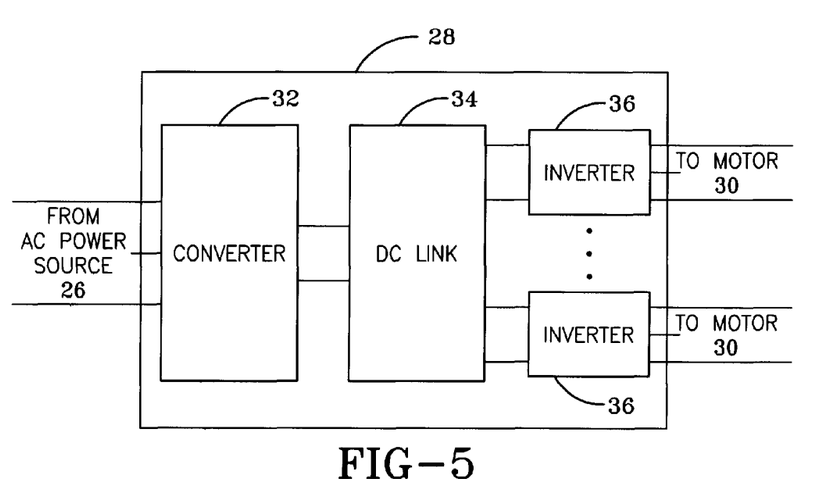
FIG. 5 diagrammatically shows an exemplary embodiment of a VSD system with a plurality of inverters.

FIGS. 4 and 5 illustrate different embodiments of VSD 28. VSD 28 can have three stages: a converter stage 32, a DC link stage 34 and an output stage having one inverter 36 (see FIG. 4) or a plurality of inverters 36 (see FIG. 5). Converter 32 converts the fixed line frequency, fixed line voltage AC power from AC power source 26 into DC power. DC link 34 filters the DC power from converter 32 and provides energy storage components. DC link 34 can be composed of capacitors and inductors, which are passive devices that exhibit high reliability rates and very low failure rates. Finally, in the embodiment shown in FIG. 4, inverter 36 converts the DC power from DC link 34 into variable frequency, variable voltage AC power for motor 30 and, in the embodiment shown in FIG. 5, inverters 36 are connected in parallel on DC link 34. Each inverter 36 converts the DC power from DC link 34 into a variable frequency, variable voltage AC power for corresponding motor 30. Inverter(s) 36 can be a power module that can include power transistors, insulated gate bipolar transistor (IGBT) power switches and inverse diodes interconnected with wire bond technology. It is to be understood that DC link 34 and the inverter(s) 36 of VSD 28 can incorporate different components from those discussed above so long as DC link 34 and inverter(s) 36 of VSD 28 can provide motors 30 with appropriate output voltages and frequencies.

With regard to FIGS. 3 and 5, inverters 36 can be jointly controlled by a control system such that each inverter 36 provides AC power at the same desired voltage and frequency to corresponding motors based on a common control signal or control instruction provided to inverters 36. In another embodiment, inverters 36 can be individually controlled by a control system to permit each inverter 36 to provide AC power at different desired voltages and frequencies to corresponding motors 30 based on separate control signals or control instructions provided to each inverter 36. The capability of individual control permits inverters 36 of VSD 28 to more effectively satisfy motor 30 and system demands and loads independent of the requirements of other motors 30 and systems connected to other inverters 36. For example, one inverter 36 can be providing full power to a motor 30, while another inverter 36 is providing half power to another motor 30. The control of inverters 36 in either embodiment can be by a control panel or other suitable control device.

For each motor 30 to be powered by VSD 28, there is a corresponding inverter 36 in the output stage of VSD 28. The number of motors 30 that can be powered by VSD 28 is dependent upon the number of inverters 36 that are incorporated into VSD 28. In one embodiment, there may be either two or three inverters 36 incorporated in VSD 28 that are connected in parallel to DC link 34 and used for powering a corresponding motor (or motors) 30. While VSD 28 may have between two and three inverters 36, it is to be understood that the number of inverters 36 may exceed three, so long as the capacity of DC link 34 is sufficiently large to provide and maintain the appropriate DC voltage to each of inverters 36.

Figure 6:
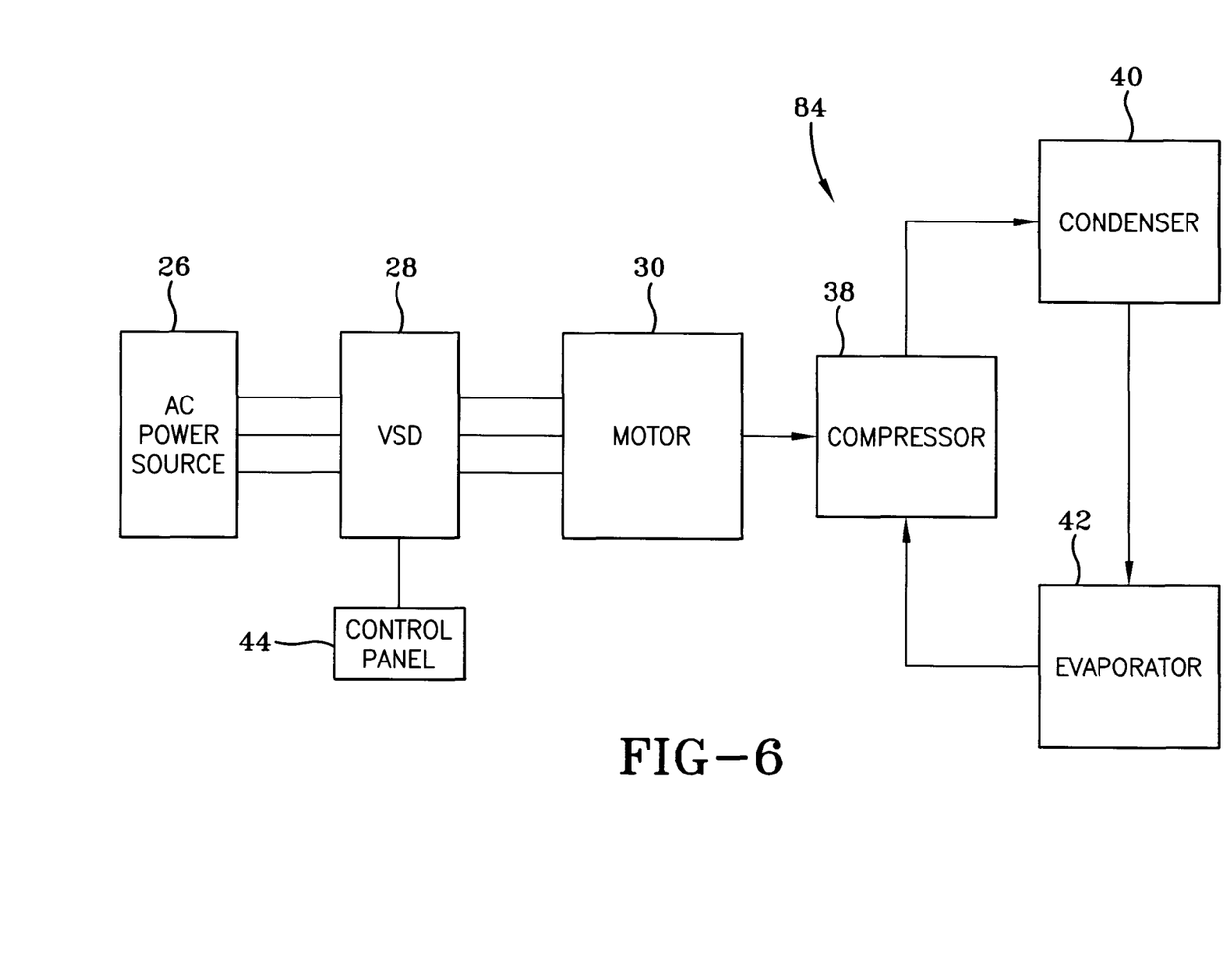
FIG. 6 diagrammatically shows an exemplary embodiment of a vapor compression system.

FIG. 6 illustrates a VSD incorporated in a vapor compression system using the system configuration and VSD 28 of FIG. 2 or 4. The vapor compression system 84 includes a compressor 38, a condenser 40, a liquid chiller or evaporator 42 and the control panel 44. The compressor 38 is driven by motor 30 that is powered by VSD 28. VSD 28 receives AC power having a particular fixed line voltage and fixed line frequency from AC power source 26 and provides AC power to motor 30 at desired voltages and desired frequencies, both of which can be varied to satisfy particular requirements. Control panel 44 can include a variety of different components such as an analog to digital (A/D) converter, a microprocessor, a non-volatile memory, and an interface board, to control operation of vapor compression system 84. Control panel 44 can also be used to control the operation of VSD 28, and motor 30.

Compressor 38 compresses a refrigerant vapor and delivers the vapor to condenser 40 through a discharge line. Compressor 38 can be any suitable type of compressor, e.g., screw compressor, centrifugal compressor, reciprocating compressor, scroll compressor, etc. The refrigerant vapor delivered by compressor 38 to condenser 40 enters into a heat exchange relationship with a fluid, e.g., air or water, and undergoes a phase change to a refrigerant liquid as a result of the heat exchange relationship with the fluid. The condensed liquid refrigerant from condenser 40 flows through an expansion device (not shown) to evaporator 42.

Evaporator 42 can include connections for a supply line and a return line of a cooling load. A process fluid, e.g., water, ethylene glycol, calcium chloride brine or sodium chloride brine, travels into evaporator 42 via return line and exits evaporator 42 via supply line. The liquid refrigerant in evaporator 42 enters into a heat exchange relationship with the process fluid to lower the temperature of the process fluid. The refrigerant liquid in evaporator 42 undergoes a phase change to a refrigerant vapor as a result of the heat exchange relationship with the process fluid. The vapor refrigerant in evaporator 42 exits evaporator 42 and returns to compressor 38 by a suction line to complete the cycle. It is to be understood that any suitable configuration of condenser 40 and evaporator 42 can be used in system 10, provided that the appropriate phase change of the refrigerant in condenser 40 and evaporator 42 is obtained.

While FIG. 6 illustrates vapor compression system 84 as having one compressor connected in a single refrigerant circuit, vapor compression system 84 can have multiple compressors powered by a single VSD as shown in FIGS. 3 and 5. Vapor compression system 84 can also have multiple VSDs, see generally the embodiment shown in FIGS. 2 and 4, connected into each of one or more refrigerant circuits.

Figure 7:
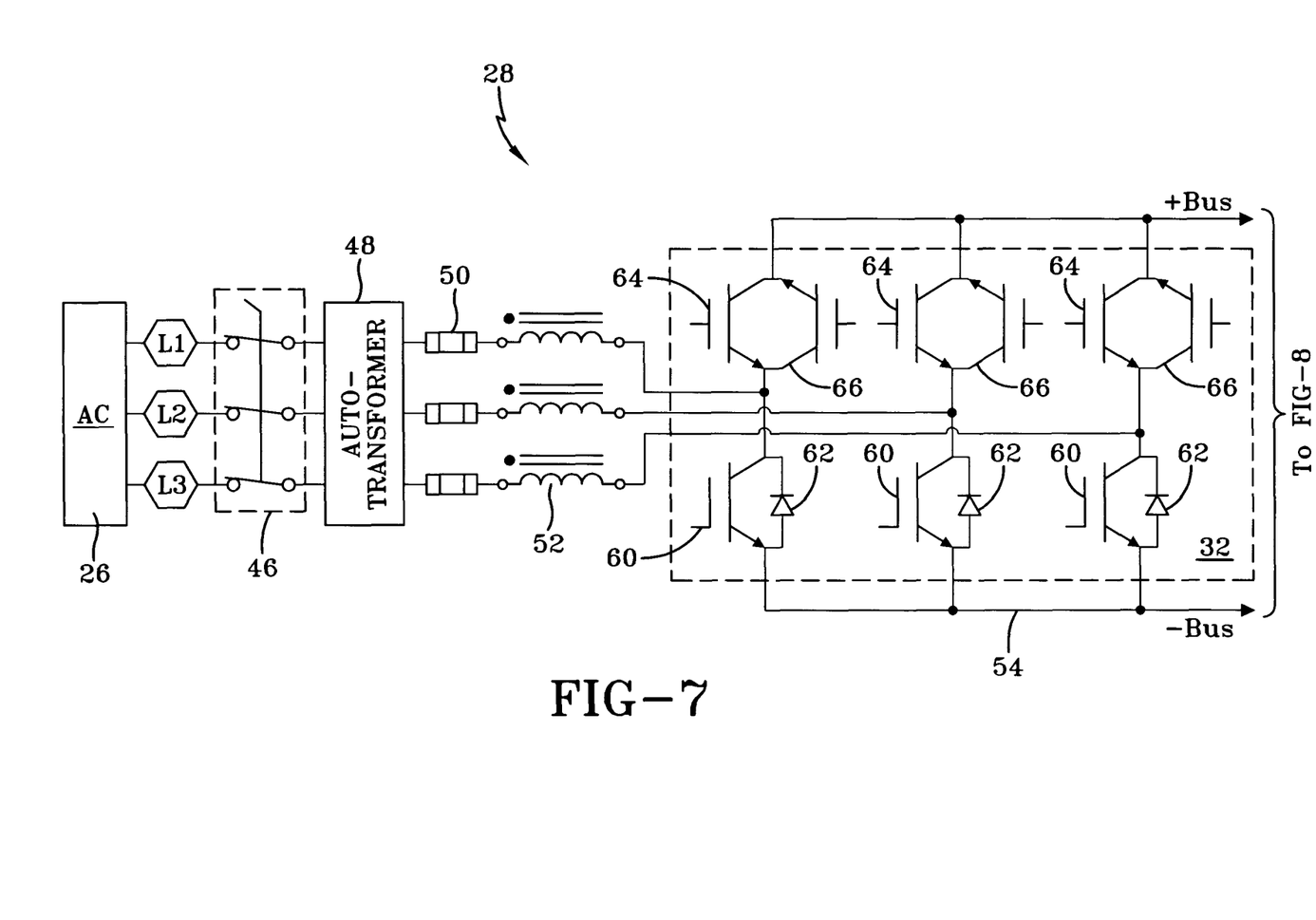
FIGS. 7 and 8 schematically show a circuit diagram for an exemplary embodiment of a VSD system.
Figure 8:
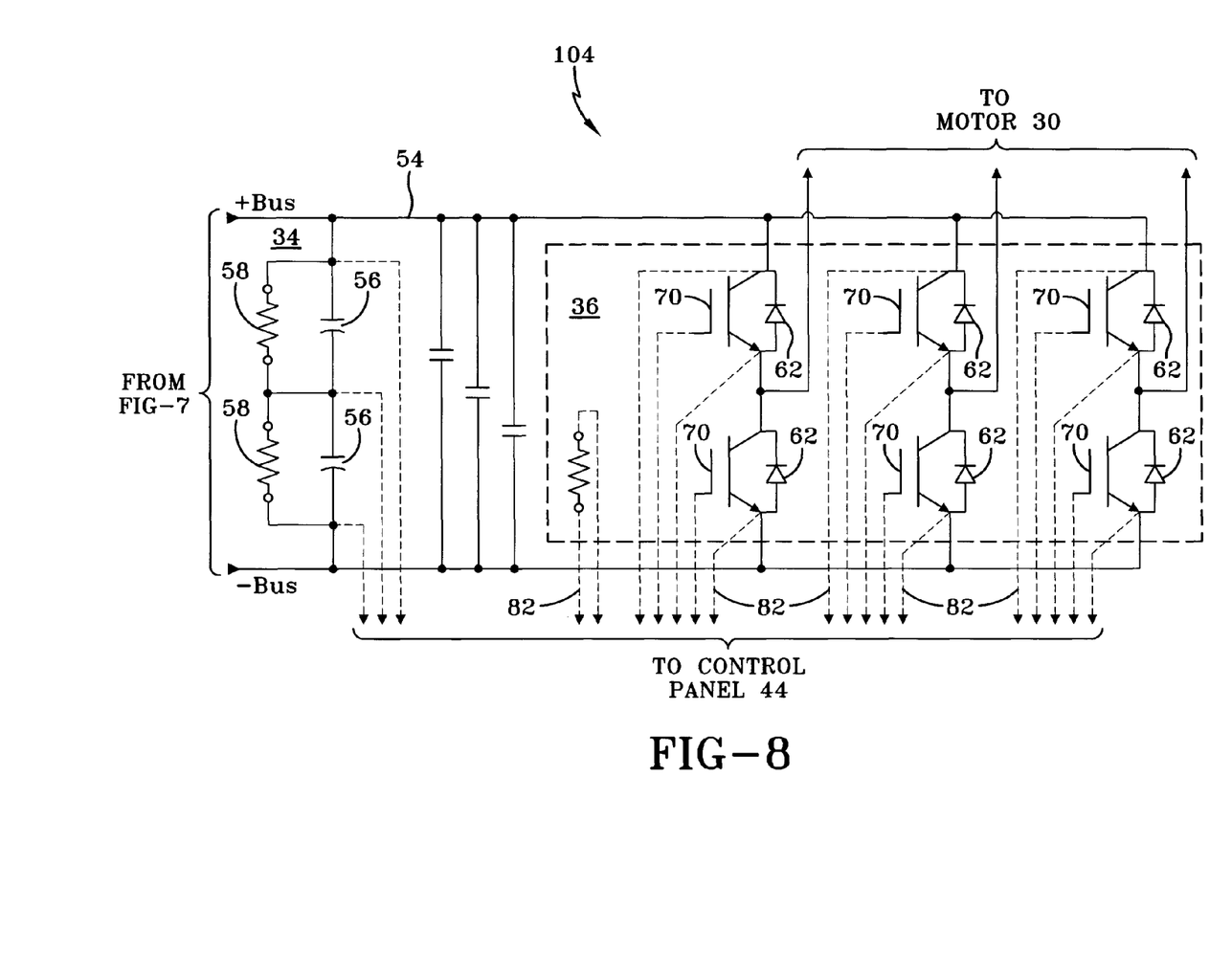

FIGS. 7 and 8 schematically show a circuit diagram for an embodiment of VSD 28. The input lines L1-L3 from three-phase AC power source 26 are connected to a circuit breaker 46. Circuit breaker 46 can disconnect VSD 28 from AC power source 26 when an excess current, voltage, or power is provided to VSD 28 by AC power source 26. On the opposite side of circuit breaker 46, an autotransformer 48 can be connected to adjust an input voltage (either up or down) from AC power source 26 to a desired input voltage. Fuses 50 for each line can be used to disconnect that input phase or line of VSD 28 in response to an excessive current in that line. Inductors 52 for each line are used to smooth the current in the corresponding line of the VSD 28. The output of each of inductors 52 is then provided to converter 32 to convert each phase of the input AC power to DC power.

In converter 32, one of the power switches in each pair of power switches is an IGBT 60 connected to an inverse or anti-parallel diode 62. IGBT 60 is used because of the high efficiency and fast switching characteristics of IGBT modules. Inverse or anti-parallel diode 62 is used to conduct current after the other power switch, IGBT 64, is turned off. IGBT 64 is turned off when VSD 28 is operated in a pulse width modulation mode. As shown in FIG. 7, IGBT 60 and inverse diode 62 are connected between the output of inductor 52 and the negative rail of DC bus 54. However, in another embodiment of the present invention, IGBT 60 and inverse diode 62 can be connected between the output of inductor 52 and the positive rail of DC bus 54.

The other power switch in the pair of power switches is a reverse blocking IGBT 64, meaning that IGBT 64 is capable of blocking voltages in the reverse as well as the forward direction. Reverse blocking IGBT 64 is connected to an inverse or anti-parallel IGBT 66, which is also a reverse blocking IGBT. Anti-parallel IGBT 66 can be gate-controlled, or switched, during precharge operation of system 28 to permit only small pulses of inrush current to reach the DC link 34 (FIG. 8). After the precharge operation is completed, anti-parallel IGBT 66 can be controlled to conduct at all times, similar to anti-parallel diode 62. Additional reverse blocking power switches, such as an IGBT power switch, for example, IGBT 60, connected in series with a diode that can provide reverse blocking, can be used instead of reverse blocking IGBT 64 and reverse blocking IGBT 66. In still another embodiment of the present invention, IGBT 60 can be replaced by reverse blocking IGBT 64.

Reverse blocking IGBT 64 can block a positive emitter-to-collector voltage that is approximately equal to the peak line-to-line voltage that appears across IGBT 64. Reverse blocking IGBT 64 can block the positive emitter-to-collector voltage for as long as the conduction of anti-parallel IGBT 66 is delayed for the purpose of a precharge condition. The reverse blocking capabilities of reverse blocking IGBT 64 and anti-parallel IGBT 66 provide reverse recovery characteristics when operated as conventional diodes. The reverse recovery characteristics of anti-parallel IGBT 66 prevent significant reverse recovery losses from occurring in anti-parallel IGBT 66 by preventing a significant reverse current from flowing in anti-parallel IGBT 66 whenever the series connected IGBT 60 in the same phase turns on. The preventing of the reverse current in anti-parallel IGBT 66 can limit the peak current value, and the corresponding losses, in the series connected IGBT 60 when series connected IGBT 60 is turned on. As shown in FIG. 7, reverse blocking IGBT 64 and anti-parallel IGBT 66 are connected between the output of inductors 52 and the positive rail of DC bus 54. However, in another embodiment of the present invention, reverse blocking IGBT 64 and anti-parallel IGBT 66 can be connected between the output of inductors 52 and the negative rail of DC bus 54.

Connected in parallel to the outputs of converter 32 is DC link 34, shown in FIG. 8. DC link 34 can include capacitors 56 and resistors 58 to filter the DC power and store energy from DC bus 54. Resistors 58 can function as voltage balancing devices to maintain a substantially equal DC link voltage between capacitors 56. Resistors 58 can also function as charge depleting devices to "bleed off" stored voltage in capacitors 56 when the power is removed from AC power source 26 (FIG. 7).

The precharge of capacitors 56 of DC link 34 may be controlled using converter module 32 shown in FIG. 7. Converter module 32 includes three pairs (one pair for each input phase) of power switches or transistors. Converter module 32 also includes the corresponding control connections to control the switching of the power switches. Control panel 44 (not shown for simplicity) selectively switches each of the power switches between and "on" or activated position and an "off" or deactivated position using a modulation scheme to precharge capacitors 56 of DC link 34. Converter module 32 can operate as a boost rectifier to provide a boosted DC voltage to DC link 34 to obtain an output voltage from VSD 28 greater than the input voltage of VSD 28.

Also connected to DC bus 54 is inverter section 36, which converts the DC power on DC bus 54 to three phase AC power for a motor 30. A single inverter section or module 36 may be used, however additional inverter modules 36 can be added to system 28. Additional inverter modules 36 would have a similar schematic representation to inverter module 36 shown in FIG. 5. Inverter 36 includes three pairs (one for each output phase) of IGBT power switches 70 and inverse diodes 62. Inverter modules 36 also include the corresponding control connections 82 to control the switching of the IGBT power switches 70.

Inverter module 36 converts the DC power on DC bus 54 to three phase AC power by selectively switching each of IGBT power switches 70 in inverter module 36 between an "on" or activated position and an "off" or deactivated position using a modulation scheme to obtain the desired AC voltage and frequency from inverter module 36. A gating signal or switching signal is provided to IGBT power switches 70 by control panel 44, based on the modulation scheme, to switch IGBT power switches 70 between the "on" position and the "off" position. IGBT power switches 70 are preferably in the "on" position when the switching signal is "High," i.e., a logical one, and in the "off" position when the switching signal is "Low," i.e., a logical zero. However, it is to be understood that the activation and deactivation of IGBT power switches 70 can be based on the opposite state of the switching signal.

Figure 9:
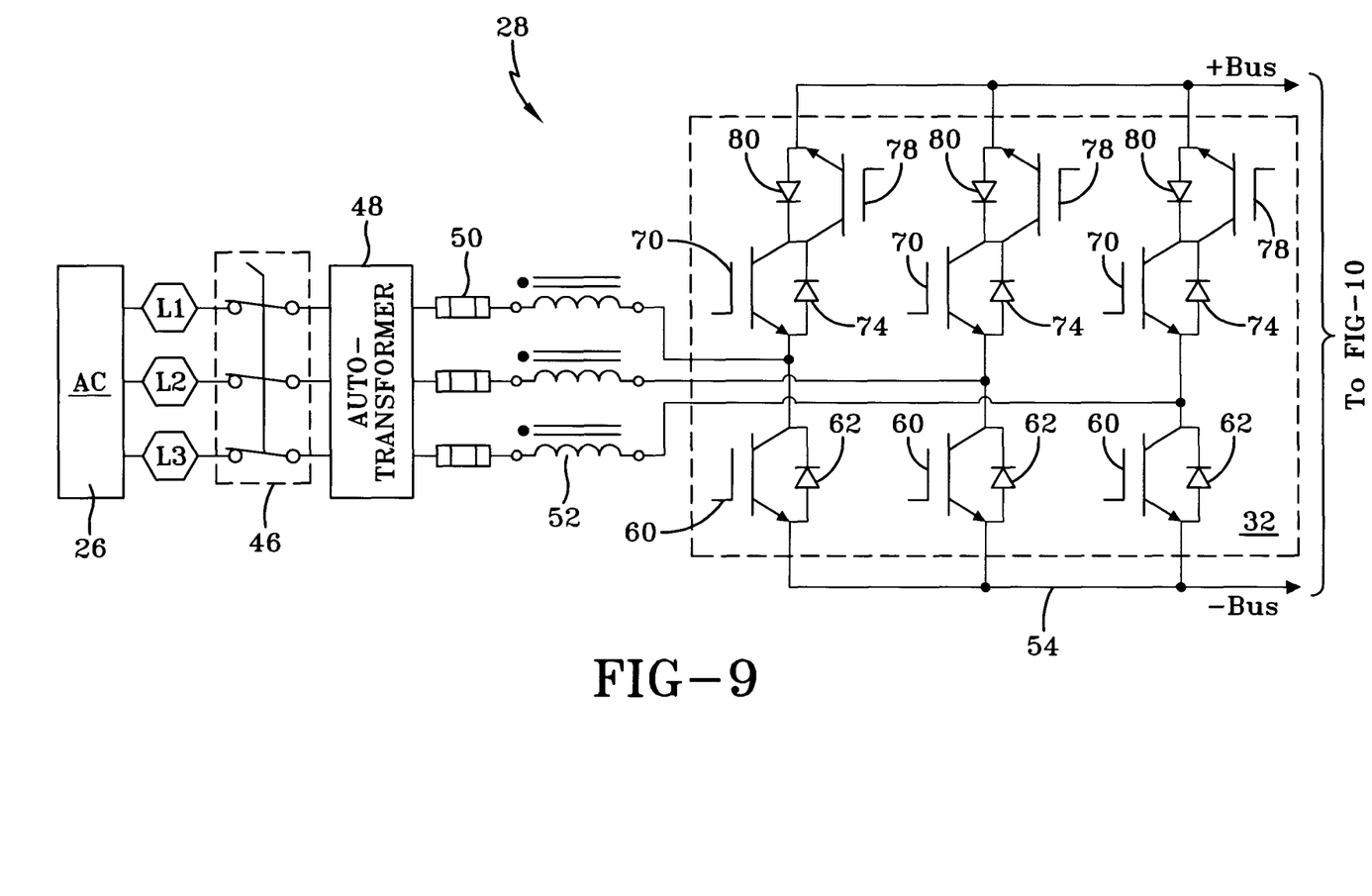
FIGS. 9 and 10 schematically show a circuit diagram for another exemplary embodiment of a VSD system.
Figure 10:
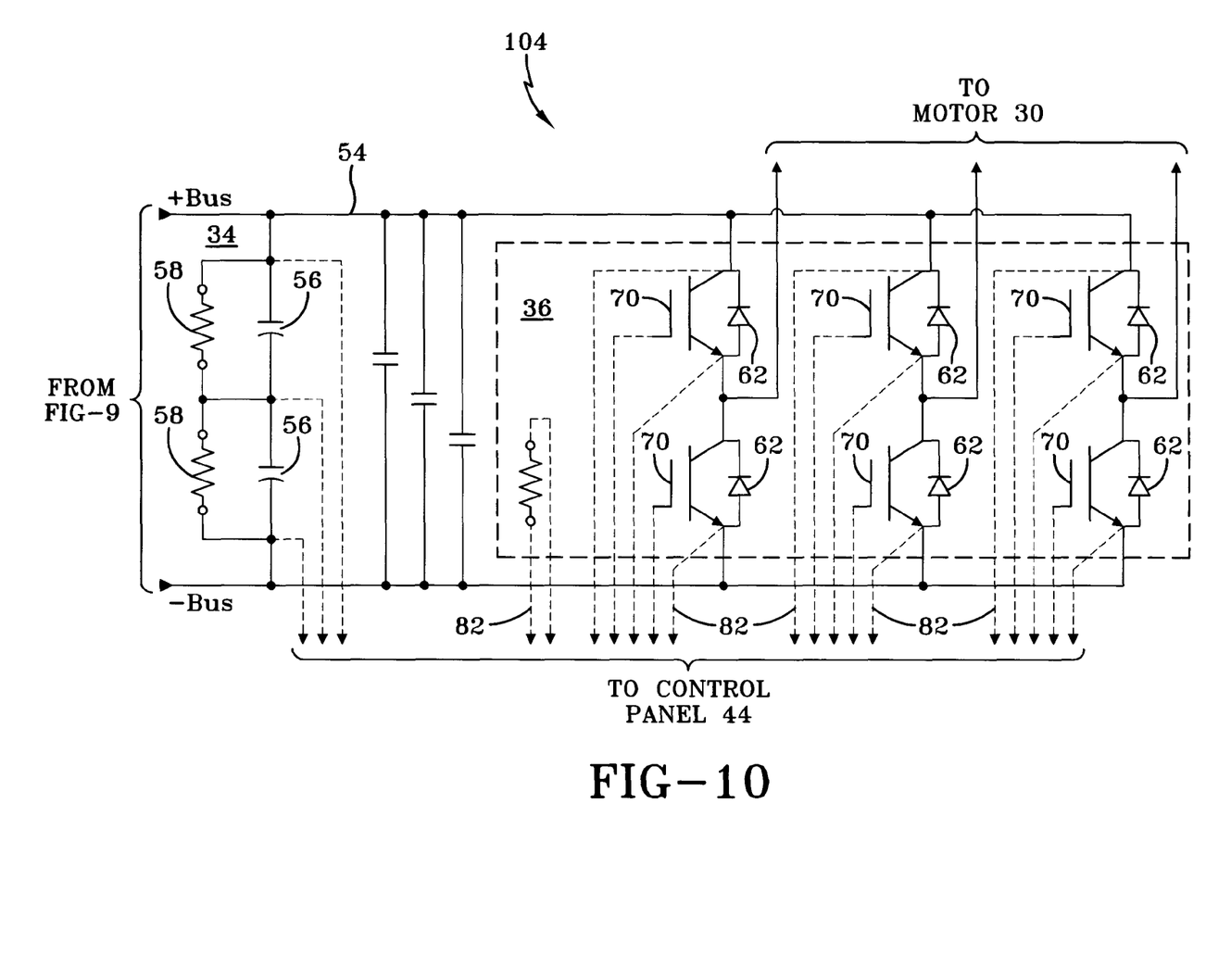

Referring now to FIGS. 9 and 10, a circuit diagram for another exemplary embodiment of VSD 28 is shown. The operation of VSD 28 in this embodiment is similar to the operation of VSD 28 described above with regard to FIGS. 7 and 8, except for the operation of converter 32. Similar to the embodiment shown in FIGS. 7 and 8, the output of each of inductors 52 is provided to converter 32 and DC link 34 is connected in parallel to the outputs of converter 32.

In converter module 32, one of the power switches in each pair of power switches is an IGBT 60 connected to an inverse or anti-parallel diode 62. Inverse or anti-parallel diode 62 is used to conduct current after IGBT 70 is turned off when VSD 28 is operated in a pulse width modulation mode. IGBT 60 and inverse diodes 62 are connected between the output of inductors 52 and the negative rail of DC bus 54. However, in another embodiment, IGBT 60 and inverse diodes 62 can be connected between the output of inductors 52 and the positive rail of DC bus 54.

The other power switch combination includes IGBT 70, with associated anti-parallel diode 74 and an auxiliary IGBT 78, and auxiliary anti-parallel diode 80. The auxiliary IGBT 78 and auxiliary diode 80 are connected between IGBT 70 and the positive rail of DC bus 54. The IGBT 78 may be controlled during the precharge operation to permit only small pulses of inrush current to reach DC link 34. After the precharge operation is completed, the IGBT 78 can be controlled to conduct at all times, similar to anti-parallel diode 74.

Converter module 32 also includes the corresponding control connections (not shown for simplicity) to control the switching of the power switches in a manner similar to that described above for inverter module 36. The power switches of converter module 32 may be IGBT power switches that are controlled by a pulse width modulation technique to generate the desired output voltages for DC link 34. The converter module 32 can operate as a boost rectifier to provide a boosted DC voltage to DC link 34 to obtain an output voltage from VSD 28 that is greater than the input voltage of VSD 28.

IGBT 78 and diode 80 are connected in parallel between IGBT 70 and positive rail of the DC bus 54, as shown in FIG. 9. However, in another embodiment, IGBT 78 and diode 80 may be connected in parallel between IGBT 60 and the negative rail of DC bus 54.

The IGBT 66 in FIG. 7 and IGBT 78 in FIG. 9 are primarily used for the precharge operation to limit the inrush current into the DC Link 34. After the precharge operation of the variable speed drive, these IGBTs are turned on all the time and they function as diodes. The IGBT 66 in FIG. 7 and IGBT 78 in FIG. 9 are used only for precharge and are gated always on after the precharging operation is completed. Thus, IGBTs 66, 78 may have a maximum current rating less than the maximum current rating of IGBTs 60, 64 in FIG. 7 and IGBTs 60, 70 in FIG. 9. The lower maximum current rating corresponds with a smaller size of IGBT 66 in FIG. 7 and IGBT 78 in FIG. 9 and results in a smaller sized converter 32 that requires less space within VSD 28 and that also costs less to produce than a converter constructed of higher current-rated IGBT devices.

During a short circuit or fault event in VSD 28, IGBT 66 and IGBT 78 having the lower maximum current ratings may experience the same short circuit current as IGBTs 60, 64 and IGBTs 60, 70 which are rated for higher current. The probability of safely turning off during such an event is improved if IGBTs 66, 78 can be made to conduct approximately equal the current as IGBTs 60, 64.

The lower current rated IGBT 66, 78 may be supplied with a higher gate to emitter voltage than the higher current rated IGBTs 60, 64 (in the case of IGBT 66 in FIG. 7) or IGBTs 60, 70 (in the case of IGBT 78 in FIG. 9) that have higher maximum current ratings. The increased gate to emitter voltage permits the lower rate IGBT 66 and IGBT 78 to support a current level that is higher than the rated current, that is, the increased gate to emitter voltage permits IGBT 66 and IGBT 78 rated at lower current to support a current level that is substantially equal to the current levels of higher current rated IGBTs 60, 64 and IGBTs 60, 70. Increasing the gate to emitter voltage of IGBTs 66, 78 improves the probability of safely turning off during a short circuit or fault of the variable speed drive.

Figure 11:
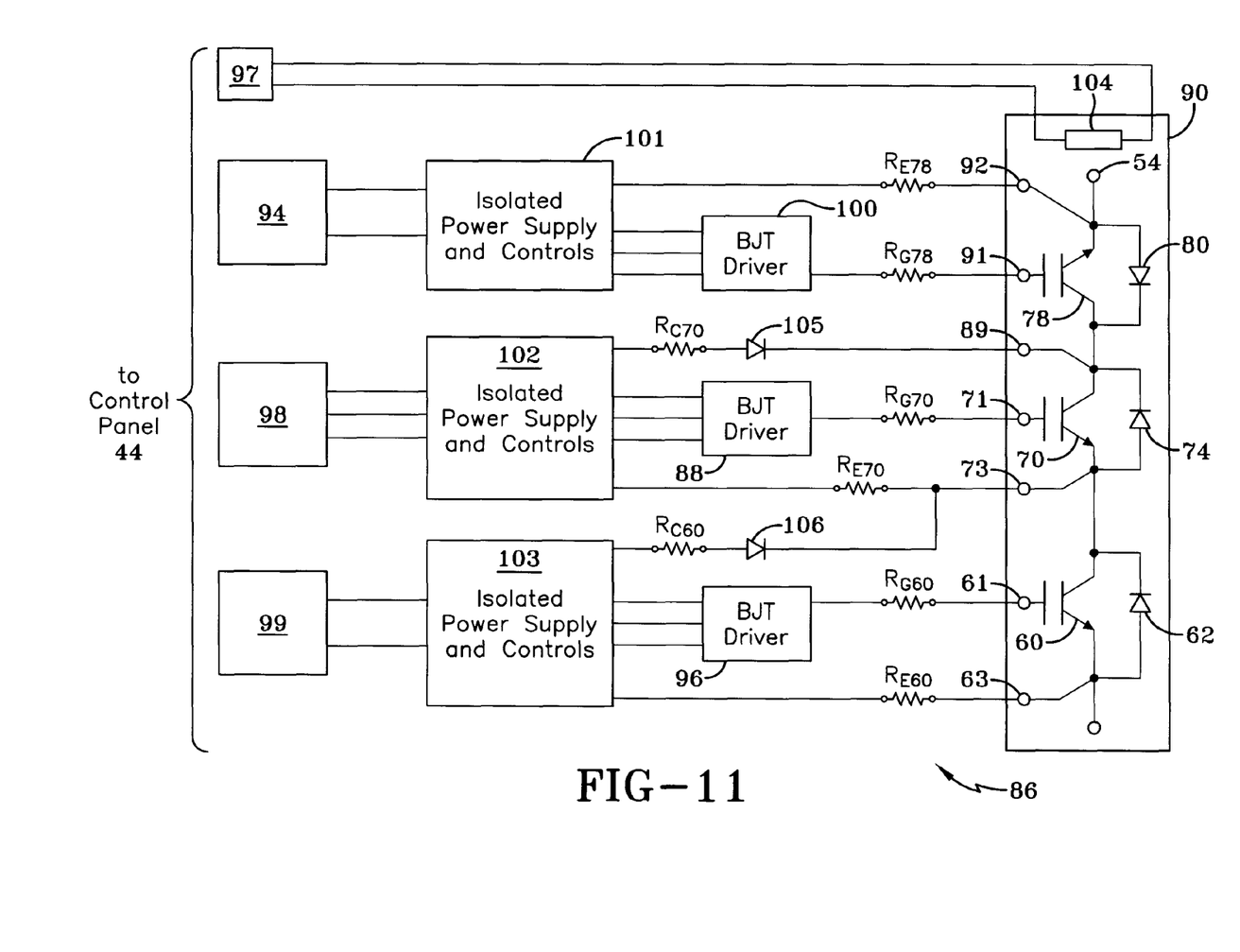
FIG. 11 shows an exemplary embodiment of a bi-polar junction transistor (BJT) driver board for an active converter IGBT switching module, for use in a converter configuration as shown in FIG. 9.

Referring now to FIG. 11, one embodiment of a gate driver board 86 with bi-polar junction transistor (BJT) drivers connected to the exemplary active converter IGBT switching module 90 for use in a converter configuration is shown in FIG. 9. Auxiliary IGBT 78, and auxiliary anti-parallel diode 80 are connected between IGBT 70 and the positive rail of DC bus 54. The IGBT 78 may be controlled during a precharge operation to permit only small pulses of inrush current to reach DC link 34. After the precharge operation is completed, IGBT 78 can be controlled to conduct at all times, similar to anti-parallel diode. Gate to emitter voltage is applied between the auxiliary gate terminal 91 and auxiliary emitter terminal 92 of IGBT 78 through gate resistor $R_G$ and emitter resistor $R_E$ using the BJT driver circuit 100. In at least one exemplary embodiment the applied gate to emitter voltage of auxiliary IGBT 78 $V_{GE\_AUX}$ may be in the range of 17V to 20V. Stated another way, $V_{GE\_AUX}$ may be approximately 1.133 and 1.333 times that of a gate to emitter voltage for controlling a standard IGBT. Gate signal for the auxiliary IGBT 78 is generated from control panel 44 connected through an external connector 94. $V_{GE\_AUX}$ is applied in varying length of pulses during precharge operation as described above. When the precharge operation is completed, $V_{GE\_AUX}$ is applied continuously, causing IGBT 78 to conduct at all times.

The gate driver board 86 also includes BJT driver circuits 88 and 96 connected to IGBTs 70 and 60 respectively. Gate to emitter voltage is applied between the gate terminal 71 and emitter terminal 73 of IGBT 70 through gate resistor $R_G$ and emitter resistor $R_E$ using the BJT driver circuit 88. Similarly, gate to emitter voltage is applied to gate terminal 61 and emitter terminal 63 of IGBT 60 through a gate resistor $R_G$ and emitter resistor $R_E$ using the BJT driver circuit 96. BJT driver circuits 88 and 96 apply standard gate to emitter voltage $V_{GE}$ of approximately 15V for switching IGBTs 70 and 60. BJT driver circuits 88, 96 receive control input signals from isolated power and controls 102, 103, respectively. Isolated power and controls 102, 103 communicate with control panel 44 through external connectors 98, 99, respectively. A thermistor 104 on switching module 90 may be connected to control panel 44 through connector 97 for temperature control of the IGBTs 60, 70, 78. Blocking diodes 105, 106 are connected in series between isolated power supply and controls 102, 103 and high voltages present at terminals 89, 73.

While the method of supplying higher gate to emitter voltage to the lower current rated switches for improving the reliability of the variable speed drive is described using IGBTs in the exemplary embodiments, this method applies for any gate-controlled semiconductor device switch or device.

While only certain features and embodiments of the invention have been illustrated and described, many modifications and changes may occur to those skilled in the art (for example, variations in sizes, dimensions, structures, shapes and proportions of the various elements, values of parameters (for example, temperatures, pressures, etc.), mounting arrangements, use of materials, colors, orientations, etc.) without materially departing from the novel teachings and advantages of the subject matter recited in the claims. It is, therefore, to be understood that the appended claims are intended to cover all such modifications and changes as fall within the true spirit of the invention. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

What is claimed is:

1. A converter module for a variable speed drive comprising: a plurality of switching modules, one switching module of the plurality of switching modules comprising a first semiconductor switch connected in anti-parallel or series with a second semiconductor switch, the second semiconductor switch being controllably switched during a precharge operation of the variable speed drive to limit an inrush current into the DC link, and the second semiconductor switch comprising a maximum current rating less than a maximum current rating of the first semiconductor switch;
   wherein the first semiconductor switch is controlled by applying a first voltage, and the second semiconductor switch is controlled by a second voltage greater than the first voltage.

2. The converter module of claim 1, wherein the second semiconductor switch is selected from the group consisting of an insulated gate bipolar transistor, bipolar junction transistor, a metal-oxide semiconductor field-effect transistor, and a silicon controlled rectifier.

3. The converter module of claim 1, wherein the first semiconductor switch and the second semiconductor switch are connected between the output of at least one inductor and a positive rail of a DC bus.

4. The converter module of claim 1, wherein the second semiconductor switch is in an open position during operation of the variable speed drive after precharge operation, the open position of the second semiconductor switch being configured to allow current to carry through the first semiconductor switch during operation of the variable speed drive.

5. The converter module of claim 4, wherein the first semiconductor switch is switched to an open position during a precharge condition of the variable speed drive, substantially preventing current through the first semiconductor switch during precharge conditions of the variable speed drive.

6. The converter module of claim 4, wherein the second voltage is in a range of 17 volts to 20 volts, and the first voltage is 15 volts.

7. A variable speed drive comprising: a converter connected to an AC power source providing an input AC power, the converter being configured to convert the fixed input AC voltage to a DC voltage; a DC link connected to the converter, the DC link being configured to filter the DC voltage and store energy from the converter; and an inverter connected to the DC link, the inverter being configured to convert a DC voltage from the DC link into the output power having a variable voltage and a variable frequency; and the converter comprises a precharge circuit, the precharge circuit comprising a plurality of switching modules, one switching module of the plurality of switching modules comprising a first semiconductor switch connected in anti-parallel or series with a second semiconductor switch, the second semiconductor switch being controllably switched during a precharge operation of the variable speed drive to limit an inrush current into the DC link, and the second semiconductor switch comprising a maximum current rating less than a maximum current rating of the first semiconductor switch;
   wherein the first semiconductor switch is controlled by applying a first voltage, and the second semiconductor switch is controlled by a second voltage greater than the first voltage.

8. The variable speed drive of claim 7, wherein the second semiconductor switch is selected from the group consisting of an insulated gate bipolar transistor, a bipolar junction transistor, a metal-oxide semiconductor field-effect transistor, and a silicon controlled rectifier.

9. The variable speed drive of claim 7, wherein the second semiconductor switch is in an open position during operation of the variable speed drive after precharge operation, the open position of the second semiconductor switch being configured to allow current to carry through the first semiconductor switch during operation of the variable speed drive.

10. The variable speed drive of claim 7, wherein the first semiconductor switch is switched to an open position during a precharge condition of the variable speed drive, substantially preventing current to carry through the first semiconductor switch during precharge conditions of the variable speed drive.

11. The variable speed drive of claim 7, wherein the first semiconductor switch and the second semiconductor switch are connected between the output of at least one inductor and a positive rail of a DC bus.

12. The variable speed drive of claim 7, wherein the first semiconductor switch and the second semiconductor switch are connected in parallel.

13. The variable speed drive of claim 7, wherein the first semiconductor switch and the second semiconductor switch are connected in series.

14. The converter module of claim 7, wherein the second semiconductor switch gate to emitter voltage is in a range of 17 volts to 20 volts, and the standard gate to emitter voltage is 15 volts.

15. A drive for a system comprising: a variable speed drive, the variable speed drive being configured to receive an input AC power at a fixed input AC voltage and a fixed input frequency and provide an output power at a variable voltage and variable frequency, the variable voltage having a maximum voltage greater in magnitude than the fixed input AC voltage and the variable frequency having a maximum frequency greater than the fixed input frequency, the variable speed drive comprising: a converter connected to an AC power source providing an input AC power, the converter being configured to convert the fixed input AC voltage to a DC voltage; a DC link connected to the converter, the DC link being configured to filter the DC voltage and store energy from the converter; an inverter connected to the DC link, the inverter being configured to convert a DC voltage from the DC link into the output power having a variable voltage and a variable frequency; and the converter comprises a precharge circuit, the precharge circuit comprising a plurality of switching modules, one switching module of the plurality of switching modules comprising a first semiconductor switch connected in anti-parallel or series with a second semiconductor switch, the second semiconductor switch being controllably switched during a precharge operation of the variable speed drive to limit an inrush current into the DC link, and the second semiconductor switch comprising a maximum current rating less than a maximum current rating of the first semiconductor switch;

wherein the first semiconductor switch is controlled by applying a first voltage, and the second semiconductor switch is controlled by a second voltage greater than the first voltage.

16. The drive of claim 15, wherein the second semiconductor switch is selected from the group consisting of an insulated gate bipolar transistor, a bipolar junction transistor, a metal-oxide semiconductor field-effect transistor, and a silicon controlled rectifier.

17. The drive of claim 15, wherein the second semiconductor switch is in an open position during operation of the variable speed drive after precharge operation, the open position of the second semiconductor switch being configured to allow current to carry through the first semiconductor switch during operation of the variable speed drive.

18. The drive of claim 15, wherein the first semiconductor switch is switched to an open position during a precharge condition of the variable speed drive, substantially preventing current to carry through the first semiconductor switch during precharge conditions of the variable speed drive.

* * * * *